United States Patent
Bernier et al.

(10) Patent No.: US 10,418,269 B2
(45) Date of Patent: Sep. 17, 2019

(54) STORING AND ORGANIZING MINIMUM CONTACT AREA FEATURES AND WAFER TRANSFER PINS DURING SYSTEM MAINTENANCE

(71) Applicant: Lam Research Corporation, Fremont, CA (US)

(72) Inventors: Terrence George Bernier, Hillsboro, OR (US); Joseph Wei, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 418 days.

(21) Appl. No.: 15/214,943

(22) Filed: Jul. 20, 2016

(65) Prior Publication Data

US 2017/0162423 A1    Jun. 8, 2017

Related U.S. Application Data

(60) Provisional application No. 62/263,255, filed on Dec. 4, 2015.

(51) Int. Cl.
  *H01L 21/687* (2006.01)
  *B65D 25/10* (2006.01)
  *H01L 21/67* (2006.01)
  *H01L 21/673* (2006.01)

(52) U.S. Cl.
  CPC ........ *H01L 21/68742* (2013.01); *B65D 25/10* (2013.01); *H01L 21/673* (2013.01); *H01L 21/67294* (2013.01); *H01L 21/68785* (2013.01)

(58) Field of Classification Search
  CPC ......... H01L 21/68742; H01L 21/67294; H01L 21/673; H01L 21/68785; B65D 25/10; B65D 1/34; B65D 1/36; A47G 19/00; A47G 19/06; A47G 19/065; A47G 23/06; A47G 23/0616; A47G 23/0625; A47G 23/0633; A47G 23/0641
  USPC ....... 206/557, 558, 561, 562, 563, 564, 565, 206/567, 217; D7/550.1, 553.1–553.8, D7/554.2–554.4, 555, 549, 587; 220/556, 220/23.83
  See application file for complete search history.

(56) References Cited

U.S. PATENT DOCUMENTS

| | | | |
|---|---|---|---|
| 5,346,070 A | | 9/1994 | McSpadden |
| 5,772,038 A | | 6/1998 | Murata et al. |
| D396,955 S | * | 8/1998 | Iversen .......................... D19/75 |

(Continued)

OTHER PUBLICATIONS

Search Report dated Mar. 31, 2017 corresponding to European Patent Application No. 16201598.6, 7 pages.

*Primary Examiner* — Steven A. Reynolds
*Assistant Examiner* — Javier A Pagan

(57) ABSTRACT

A tray for storing minimum contact area (MCA) components of a substrate processing system includes a first compartment including at least one of a first lift pin tray and a first plurality of holes. The first lift pin tray includes a plurality of slots configured to retain lift pins of the substrate processing system. The first plurality of holes is configured to receive MCA pins of the substrate processing system. A first cup is arranged adjacent to the first compartment. The first cup includes a wall at least partially surrounding the first cup, the wall separates the first cup from the first compartment, and an upper edge of the wall extends above a bottom surface of the first compartment.

15 Claims, 8 Drawing Sheets

(56) References Cited

U.S. PATENT DOCUMENTS 9,539,757 B2 * 1/2017 Ramirez ............... B65B 5/068
2001/0030139 A1 * 10/2001 Gagliardi, Jr. ....... A47G 19/025
206/459.5

* cited by examiner

STORING AND ORGANIZING MINIMUM CONTACT AREA FEATURES AND WAFER TRANSFER PINS DURING SYSTEM MAINTENANCE

CROSS-REFERENCE TO RELATED APPLICATIONS

This application claims the benefit of U.S. Provisional Application No. 62/263,255, filed on Dec. 4, 2015. The entire disclosure of the application referenced above is incorporated herein by reference.

FIELD

The present disclosure relates to systems and methods for storing and organizing components of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, cleaning, and/or other treatment of substrates such as semiconductor wafers. Example processes that may be performed on a substrate include, but are not limited to, a plasma enhanced chemical vapor deposition (PECVD) process, an atomic layer deposition (ALD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes. A substrate may be arranged on a substrate support, such as a pedestal in a processing chamber of the substrate processing system. For example only, during deposition, a gas mixture including one or more precursors is introduced into the processing chamber and plasma is struck to deposit films on the substrate.

Some pedestals (e.g., including, but not limited to, pedestals used in PECVD and ALD substrate processing systems) may include one or more components that may be removed during maintenance of the substrate processing system. These components may include minimum contact area (MCA) balls or bearings, MCA pins, and/or lift pins. In some examples, an MCA bearing and a corresponding MCA pin are arranged in respective holes in a surface of the pedestal. A first end of the MCA pin is supported by the MCA bearing inside the hole and a second end of the MCA pin extends from the hole. In other examples, only MCA pins are arranged in the respective holes. The substrate is supported on the pedestal by the second ends of the MCA pins. The lift pins are arranged in the pedestal and are configured to be selectively lifted and/or retracted to lift the substrate off of the pedestal (i.e., off of the MCA pins) and to lower the substrate onto the pedestal.

SUMMARY

A tray for storing minimum contact area (MCA) components of a substrate processing system includes a first compartment including at least one of a first lift pin tray and a first plurality of holes. The first lift pin tray includes a plurality of slots configured to retain respective lift pins of the substrate processing system. The first plurality of holes is configured to receive respective MCA pins of the substrate processing system. A first cup is arranged adjacent to the first compartment. The first cup includes a wall at least partially surrounding the first cup, the wall separates the first cup from the first compartment, and an upper edge of the wall extends above a bottom surface of the first compartment.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
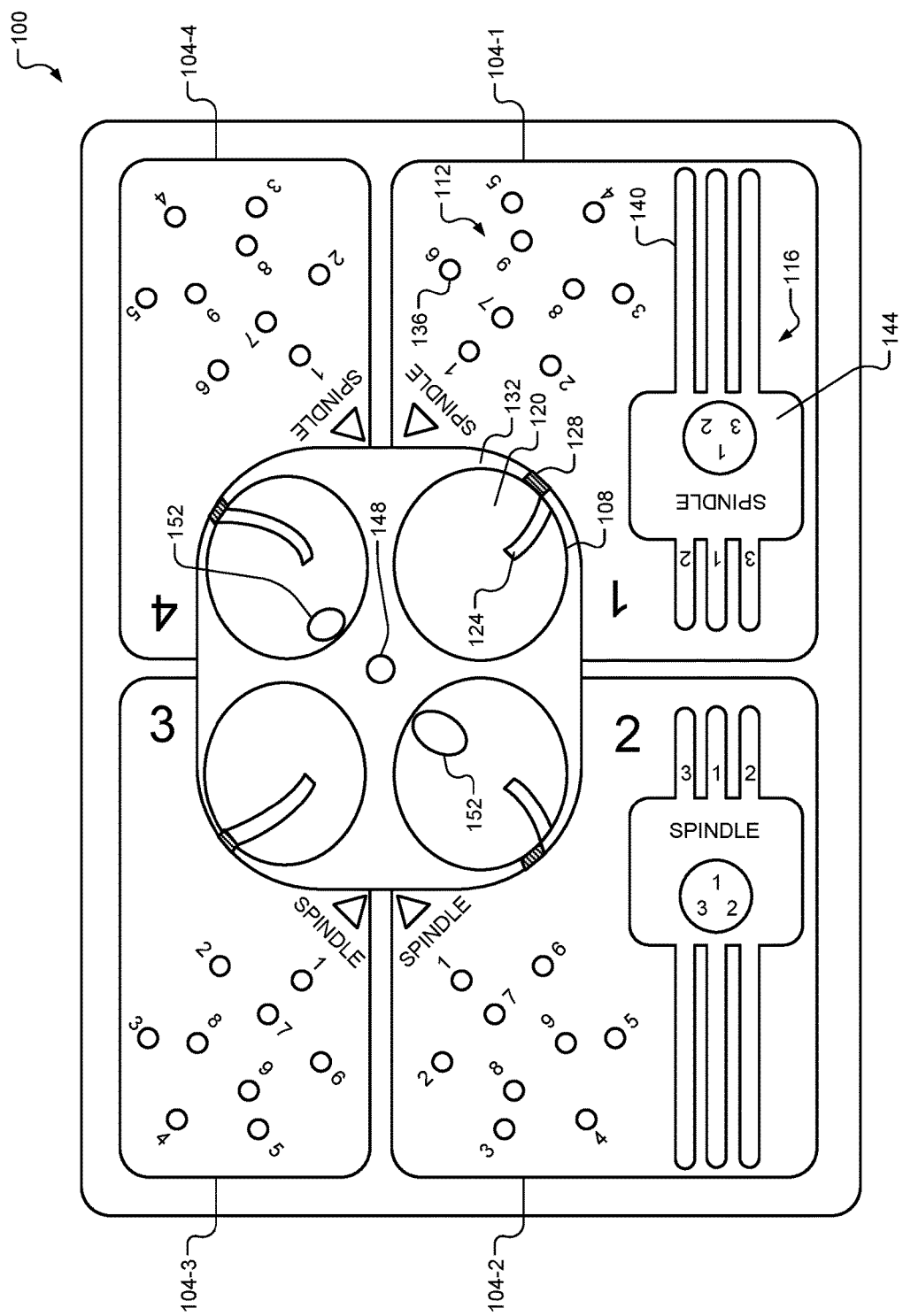
FIG. 1 illustrates an example minimum contact area (MCA) component tray according to the principles of the present disclosure.

Substrate support (e.g., pedestal) components such as minimum contact area (MCA) balls or bearings, MCA pins, and/or lift pins may be removed during maintenance of a substrate processing system. In some implementations, it may be critical to replace each of the components in a same respective location of the substrate support that the component was removed from.

Accordingly, how the removed components are stored during maintenance may determine the difficulty of accurately replacing the components after the maintenance is complete. In one example, the components may be stored in respective compartments of a case including a plurality of rows of compartments. For example, each row of the case may be assigned to a different pedestal, and each compartment in each row may be assigned to a different component of that pedestal. However, the components may become statically charged during storage, and it may be difficult to remove the components from the respective compartments. In another example, components may simply be placed in trays, cups, and/or on other cleanroom materials during maintenance.

The methods described above do not efficiently and accurately store, organize, and track the removed components. Other factors (e.g., variable length lift pins, variable length MCA pins for adjusting the height of an MCA component from a surface of the pedestal, etc.) further complicate storage, retrieval, and replacement of the components.

Systems and methods according to the principles of the present disclosure provide a configurable MCA component tray for storing and organizing substrate support components. The tray is configurable based on the associated substrate processing system to facilitate storing, identifying, and recovering the components and to minimize the likelihood of dropping, swapping (i.e., mixing up two or more of the components), or breaking the components.

The MCA component tray may include a lift pin tray, an MCA pin pattern, and/or an MCA bearing cup. The lift pin tray includes one or more slots configured to accept respective lift pins, and may identify the lift pins by number and location in relation to a fixed feature (e.g., a spindle) in a substrate processing chamber associated with the substrate support. The lift pin tray may include rectangular sub-tray (e.g., overlapping and having a greater depth than) the slots to facilitate removal of the lift pins from the slots. Further, MCA bearings that are dropped may be captured by the sub-tray to facilitate retrieval.

The MCA pin pattern includes a plurality of pin holes configured to accept MCA pins inserted therein. The pin holes may be arranged in a same pattern as the MCA pins are arranged in the substrate support pedestal in relation to a fixed feature (e.g., the spindle). The MCA pins may be retrieved from the pin holes by hand or by using an MCA pickup tool (e.g., a hollow cylindrical tool configured to capture MCA bearings). In some examples, a respective MCA bearing may also be stored in each of the pin holes. For example, the MCA bearing may be inserted in the pin hole and the corresponding MCA pin may be inserted in the pin hole above the MCA bearing. In this manner, respective locations of both the MCA bearings and the MCA pins are maintained. The MCA bearing may be retrieved from the pin hole using the MCA pickup tool. In some examples, one or more additional pin holes may be provided in a center region of the MCA component tray. For example, the pin holes in the center region may function as a staging area for temporarily retaining MCA pins that are being transferred between the substrate processing system and the MCA pin pattern. In some examples, the MCA component tray includes a tool tray configured to store the MCA pickup tool.

The MCA bearing cup is configured to store one or more MCA bearings. For example, each MCA bearing cup may store MCA bearings associated with a specific substrate support. The MCA bearings may be retrieved by hand and/or by using the MCA pickup tool. To facilitate retrieval by hand, each bearing cup includes a guide channel, slot, groove, track, etc. arranged in a path extending from a bottom of the cup to an edge of the cup. An MCA bearing stored in the cup will settle in the channel in the bottom of the cup. A user can capture the bearing with a finger in the bottom of the cup and slide the bearing to the edge of the cup along the path defined by the channel to be captured between the finger and a thumb of the user. Accordingly, the guide channel allows the MCA bearings to be retrieved up quickly and with precision. In some examples, a contour, shape, etc. (e.g., a radius of the curvature) of a bottom portion of the cup may be configured to prevent the MCA bearings from inadvertently being displaced from the cup (e.g., by bumping the MCA component tray).

In some examples, inner sidewalls (i.e., sidewalls adjacent to a center/interior of the MCA component tray) of two or more of the MCA bearing cups may include a slot or indentation configured to receive fingertips of the user. Accordingly, the slots facilitate pickup of the MCA component tray by improving grip and preventing slippage. Additionally or alternatively, the MCA component tray may include a handle. For example, the handle may be provided in a center region between the MCA bearing cups.

Referring now to FIG. 1, an example MCA component tray 100 according to the principles of the present disclosure is shown. The tray 100 includes one or more compartments 104-1, 104-2, 104-3, and 104-4 (referred to collectively as compartments 104) each assigned to a different substrate support (e.g., a substrate support associated with a respective substrate processing chamber or station of a substrate processing system). Each of the compartments 104 may include an MCA bearing cup 108, an MCA pin pattern 112, and/or a lift pin tray 116. One or more of the compartments 104 (e.g., 104-3 and 104-4 as shown) may not include the lift pin tray 116. For example, the compartments 104-3 and 104-4 may be assigned to substrate supports that do not use lift pins. In example embodiments, the MCA component tray 100 is formed from or coated with a chemical-resistant and anti-static material (e.g., Teflon, plastic/polymers, Delrin (e.g., polyoxymethylene), polycarbonate, HDPE, aluminum, etc.), and/or a material that facilitates discharge of static.

The MCA bearing cup 108 is configured to store one or more MCA bearings of the associated substrate support. The MCA bearing cup 108 may include a flat or concave bottom surface 120 and a guide channel 124. A user retrieves an MCA bearing from the bearing cup 108 by directing the bearing into the guide channel 124 and up the guide channel 124 through a notch 128. The notch 128 may be formed in a wall 132 surrounding and defining an outer edge or perimeter of the bearing cup 108. For example only, the wall 132 may surround the bearing cups 108 collectively or each of the bearing cups 108 may be surrounded by a respective wall 132. As shown, upper edges of the bearing cups 108 protrude above a bottom surface of the compartments 104. When the user slides the bearing up the guide channel 124 into the notch 128, the bearing can be captured between the finger and thumb of the user and opposing sides of the notch 128.

The MCA pin pattern 112 includes a plurality of pin holes 136 configured to accept MCA pins inserted therein. The pin holes 136 may be arranged in a same pattern as the MCA pins are arranged in the associated substrate support in relation to a fixed feature (e.g., a spindle of the substrate support). As shown for example only, the pin holes 136 are arranged in a 9-pin pattern, although other patterns may be provided based on the configuration of the associated substrate support, and may identify each MCA pin by number (e.g., 1 through 9). The pin holes 136 may configured to support only the MCA pins or both the MCA pins and the corresponding MCA bearings. For example, if the pin holes 136 are configured to support only the MCA pins, a depth of the pin holes 136 may correspond to a length L of the MCA pins plus some desired offset (i.e., a desired portion of the MCA pins protruding from the pin holes 136 when the MCA pins are inserted). Conversely, if the pin holes 136 are configured to support both the MCA pins and the corresponding MCA bearings, the depth of the pin holes 136 may correspond to a length L of the MCA pins plus a diameter of the MCA bearings plus the desired offset (i.e., a desired portion of the MCA pins protruding from the pin holes 136 when both the bearings and the MCA pins are inserted).

The lift pin tray 116 includes one or more slots 140 configured to accept respective lift pins, and may identify the lift pins by number (e.g., 1, 2, 3, etc.) and location in relation to a fixed feature (e.g., the spindle) in a substrate processing chamber associated with the substrate support. The lift pin tray 116 may include a rectangular sub-tray 144 under the slots 140 to facilitate removal of the lift pins from the slots 140. For example only, a depth of the sub-tray 144 may be greater than a depth of the slots 140.

The MCA component tray 100 may include one or more types of covers or lids to retain the MCA components during storage. For example, the MCA component tray 100 may include a single folding, hinged, sliding, snap-on, etc. cover or lid that encloses an entire upper surface of the MCA component tray 100. Alternatively, each compartment 104 may include a respective cover or lid.

The MCA component tray 100 may include one or more additional pin holes 148. For example only, the pin hole 148 is provided in a center region of the MCA component tray 100 between the MCA bearing cups 108. The pin hole 148 may function as a staging area for temporarily retaining MCA pins that are being transferred between the substrate processing system and respective MCA pin patterns 112 of the compartments 104.

In some examples, two or more of the MCA bearing cups 108 may include slots 152 (e.g., a recessed area, indentation, etc.) provided in respective inner sidewalls. For example, as shown, the slots 152 are provided in sidewalls of MCA bearing cups 108 on diagonally opposing sides of the center region between the MCA bearing cups 108. The slots 152 are configured to receive fingertips of the user. Accordingly, the slots 152 facilitate pickup of the MCA component tray 100 by allowing the user to pinch the MCA component tray 100 between, for example, a thumb placed in a first one of the slots 152 and one or more fingers placed in a second one of the slots 152 opposite the first one of the slots 152. Although the slots 152 are shown as elliptical/oval-shaped indentations, any suitable shape may be used.

Figure 2:
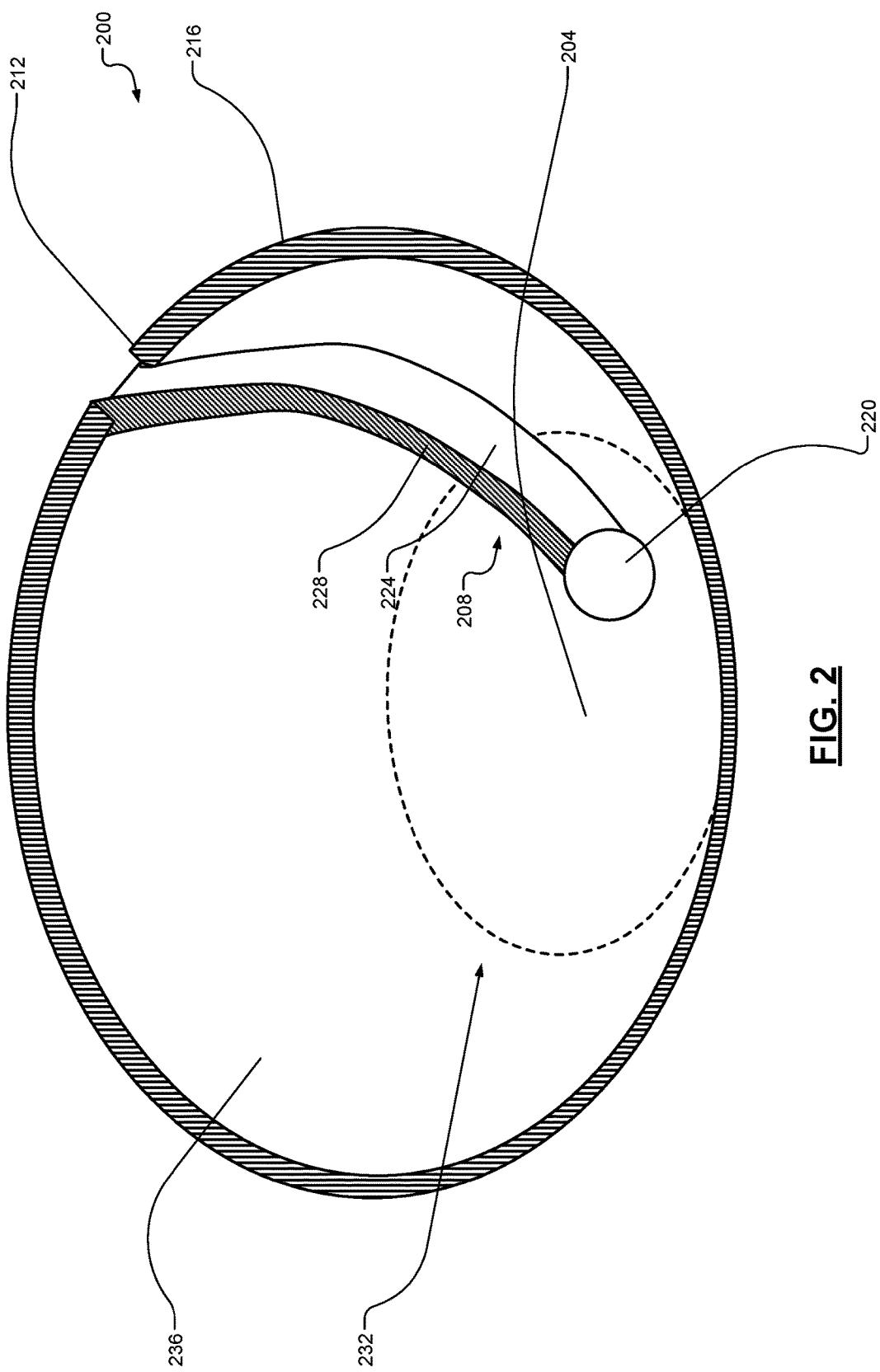
FIG. 2 is an example MCA bearing cup according to the principles of the present disclosure.

Referring now to FIG. 2, an example MCA bearing cup 200 is shown. The MCA bearing cup 200 may include a flat or concave bottom surface 204 and a guide channel 208. The guide channel 208 extends from the bottom surface 204 to a notch 212 formed in a wall 216 defining an outer edge or lip of the MCA bearing cup 200. The guide channel 208 is configured to capture and retain an MCA bearing 220. For example, as shown the guide channel 208 has a relatively flat bottom surface 224 and sidewalls 228 that are approximately perpendicular to the bottom surface 224 to facilitate retention of the MCA bearing 220. In other examples, the guide channel 208 may be rounded, concave, V-shaped, etc.

Further, although as shown the guide channel 208 terminates approximately in the center of the bottom surface 204, in other examples the guide channel 208 may extend to an opposite side of the bottom surface 204, to another notch on the opposite side of the MCA bearing cup 200, etc. In still other examples, the MCA bearing cup 200 may include two or more of the guide channels 208 and respective notches 212.

An interface (e.g., corner) 232 between sidewalls 236 of the MCA bearing cup 200 and the bottom surface 204 may have a radius of curvature designed to facilitate retention of the bearing 220 within the cup 200 while also facilitating removal of the bearing 220 via the guide channel 208. For example only, the radius of curvature of the interface 232 may be between 0.375 inches and 0.625 inches.

Figure 3:
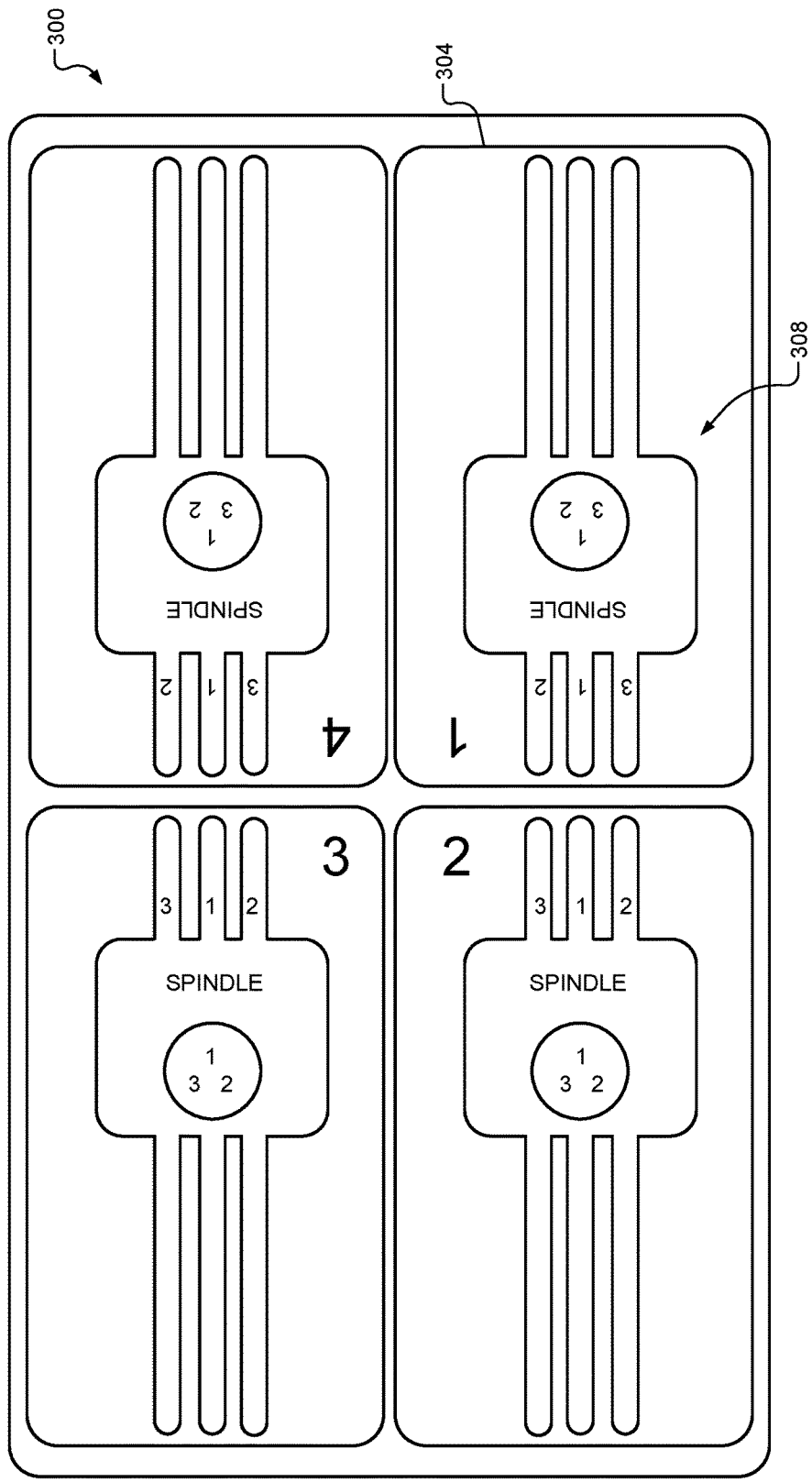
FIG. 3 illustrates an example MCA component tray including only lift pin trays according to the principles of the present disclosure.

Referring now to FIG. 3, another example MCA component tray 300 according to the principles of the present disclosure is shown. In this example, the MCA component tray 300 is configured for chambers having substrate supports that include only lift pins (i.e., the substrate supports do not include MCA components). Accordingly, each compartment 304 in the MCA component tray 300 includes only a lift pin tray 308.

Figure 4:
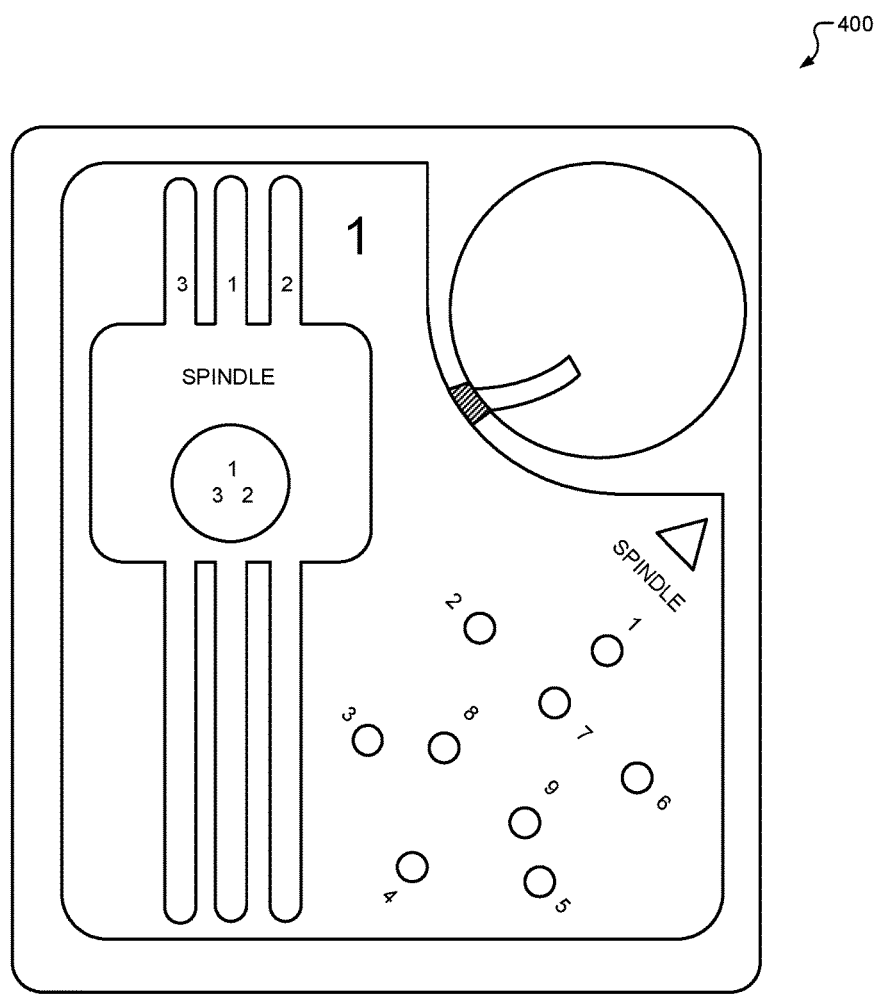
FIG. 4 illustrates an example MCA component tray for a single substrate processing chamber or station according to the principles of the present disclosure.

Referring now to FIG. 4, another example MCA component tray 400 according to the principles of the present disclosure is shown. In this example, the MCA component tray 400 is configured for a single substrate processing chamber or station (i.e., configured to accept MCA components for only a single substrate support or pedestal). In some examples, edges of the MCA component trays 400 may include connectors (e.g., complementary slots and tabs, holes and pins, etc.) configured to connect with other MCA component trays 400. In this manner, two or more of the MCA component trays 400 can be connected together to facilitate customization.

Figure 5:
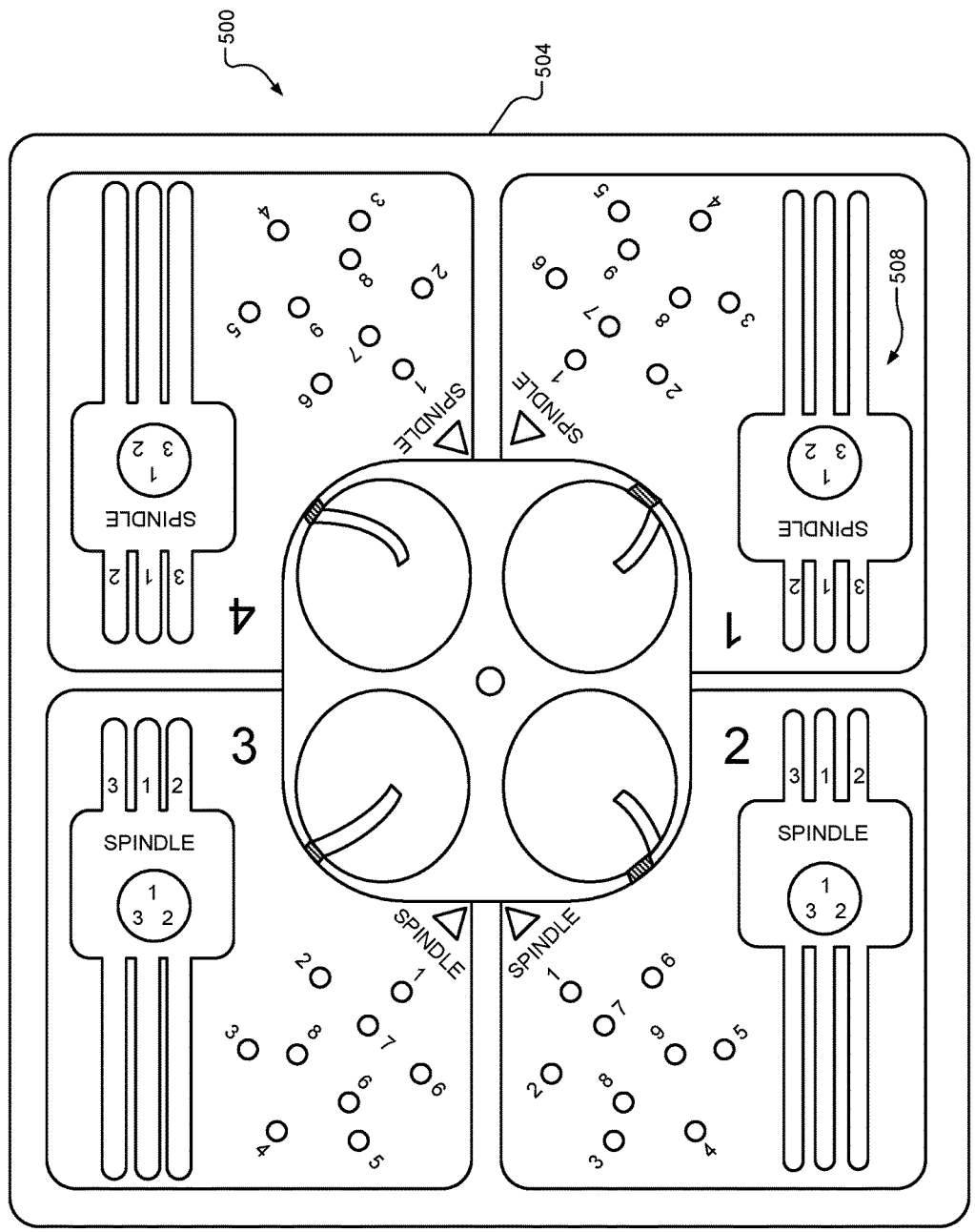
FIG. 5 illustrates another example MCA component tray according to the principles of the present disclosure.

Referring now to FIG. 5, another example MCA component tray 500 according to the principles of the present disclosure is shown. In this example, each compartment 504 includes a lift pin tray 508.

Figure 6A:
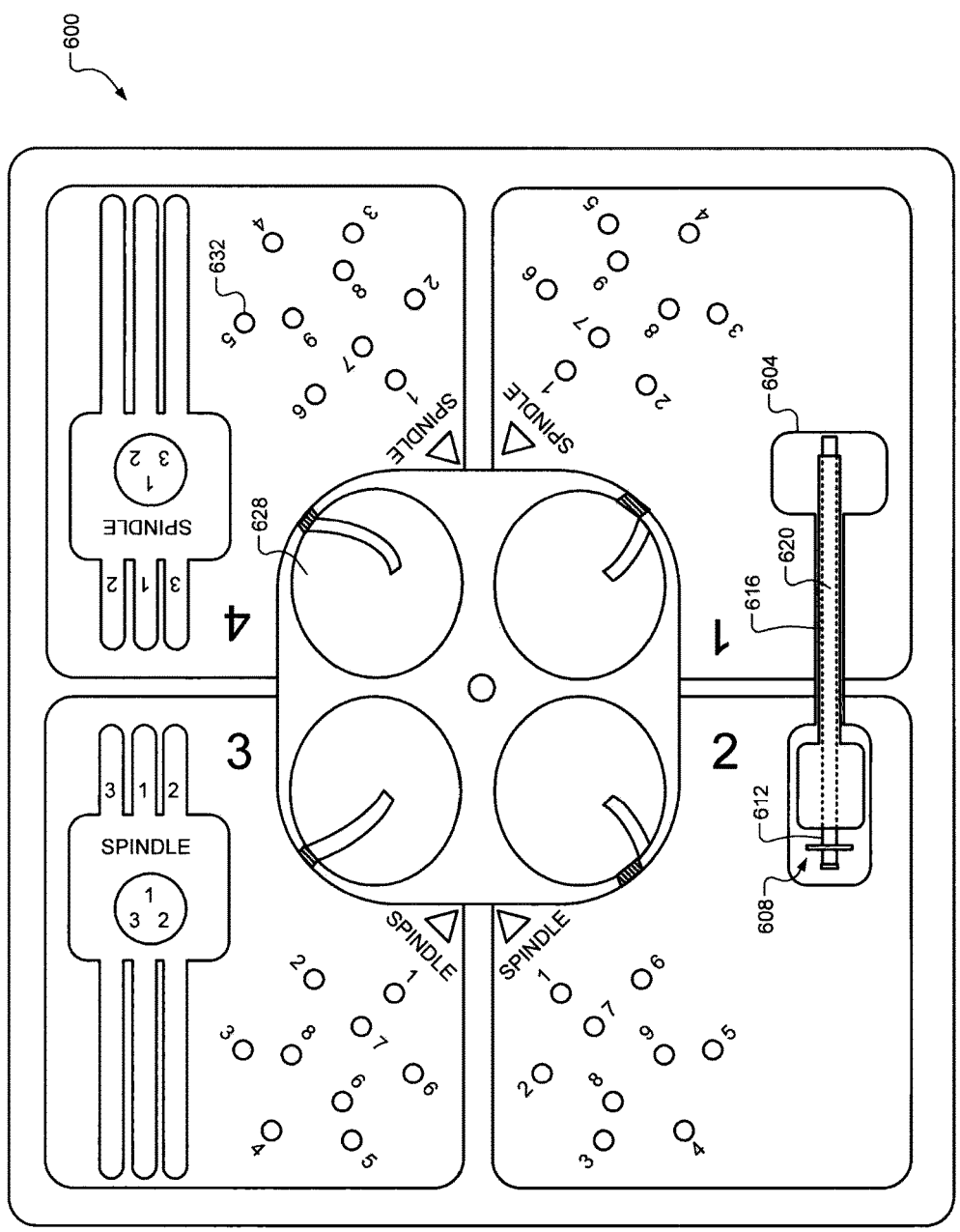
FIG. 6A illustrates an example MCA component tray including an MCA pickup tool tray according to the principles of the present disclosure.
Figure 6C:
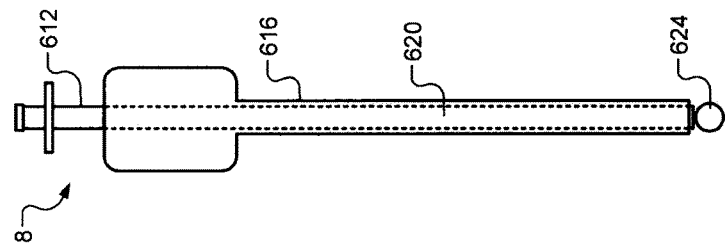
FIGS. 6B and 6C illustrate an example MCA pickup tool according to the principles of the present disclosure.
Figure 6B:
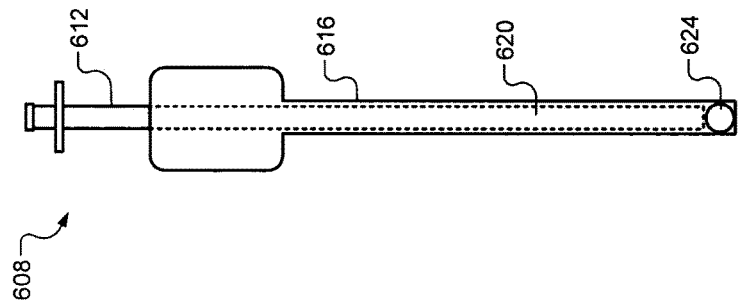

Referring now to FIGS. 6A, 6B, and 6C, an example MCA component tray 600 according to the principles of the present disclosure is shown. The MCA component tray 600 includes an MCA pickup tool tray 604 configured to store an MCA pickup tool 608. In other words, the MCA pickup tool tray 604 is shaped to accommodate features of the MCA pickup tool 608. For example only, the MCA pickup tool 608 includes a plunger 612 and an outer sleeve 616. An inner shaft 620 of the plunger 612 is arranged to slide within the outer sleeve 616. As shown in FIG. 6B, an end of the outer sleeve 616 is configured to capture an MCA bearing 624. For example, an inner diameter of the outer sleeve 616 is approximately equal to a diameter of the MCA bearing 624 allowing the outer sleeve 616 to retain the MCA bearing 624 via friction. In this manner, the MCA pickup tool 608 may be used to retrieve the MCA bearing 624 from MCA bearing cups 628, pin holes 632, etc. Conversely, depressing the plunger 612 (e.g., with a thumb while the outer sleeve 616 is secured by one or more fingers) causes the inner shaft 620 to eject the MCA bearing 624 from the outer sleeve 616 as shown in FIG. 6C.

Figure 8A:
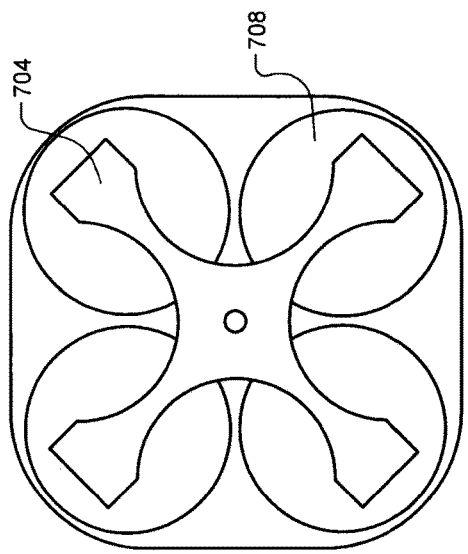
FIGS. 8A and 8B illustrate an example MCA component tray having a handle in a raised position according to the principles of the present disclosure.
Figure 8B:
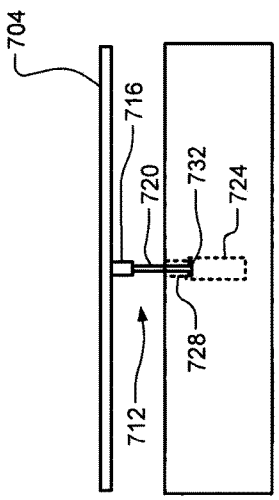
Figure 7:
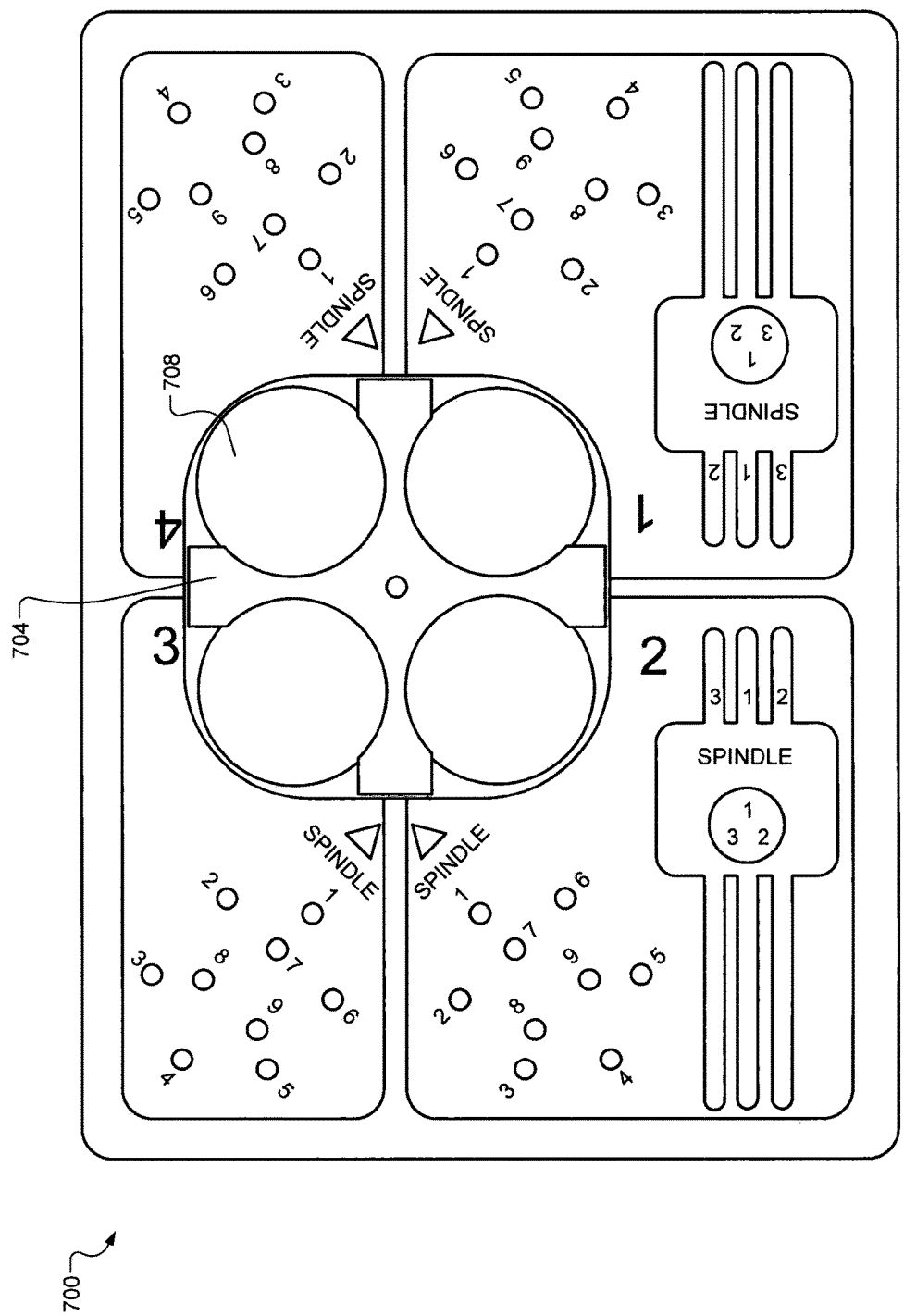
FIG. 7 illustrates an example MCA component tray including a handle according to the principles of the present disclosure.

Referring now to FIGS. 7, 8A, and 8B, an example MCA component tray 700 includes a handle 704. For illustration purposes, only a portion of the MCA component tray 700 including the handle 704 and MCA bearing cups 708 is shown in FIGS. 8A and 8B. For example, the handle 704 may be provided in a center region between the MCA bearing cups 708. As shown for example only, the handle 704 is shaped similar to a transfer plate of a substrate processing tool. The handle 704 may be actuated between a lowered position as shown in FIG. 7 and a raised position as shown in FIGS. 8A and 8B. For example only, the handle 704 may be rotatable about a shaft 712 having an axis aligned with a center point between the MCA bearing cups 708.

In one example, the handle 704 is rotatable when in the raised position and/or when between actuated from the lowered position to the raised position. Conversely, the handle 704 may be fixed (i.e., not able to rotate) when in the lowered position shown in FIG. 7. Accordingly, when the handle 704 is in the lowered position, the handle 704 does not interfere with access to the MCA bearing cups 708. However, when in the raised position, rotation of the handle 704 may allow portions of the handle 704 to overlap portions of the MCA bearing cups 708 as shown in FIG. 8A. In another example, the handle 704 may be fixed (i.e., not rotatable) in both the raised position and the lowered position.

As shown in FIG. 8B, the shaft 712 may include a square-shaped (or other polygonal or non-circular shaped) portion 716 and a circular portion 720. The MCA component tray 700 includes a hole 724 configured to receive and retain the shaft 712. The hole 724 includes an upper, square-shaped recess 728 configured to receive the square-shaped portion 716 of the shaft 712. Accordingly, when the handle 704 is in the lowered position, the square-shaped portion 716 of the shaft 712 is retained within the square-shaped recess 728 and the handle 704 is prevented from rotating. Conversely, when the handle 704 is in the raised position, the square-shaped portion 716 of the shaft 712 is removed from the square-shaped recess 728 and the shaft 712 is able to freely rotate within the hole 724. As shown for example only, the shaft 712 may include a flange 732 that prevents the handle 704 from being completely removed from the hole 724. In some examples, a lower portion (e.g., the circular portion 720) of the shaft 712 and an inner diameter of the hole 724 may be threaded. In this manner, the handle 704 may be configured to automatically rotate when raised and lowered. For example, the shaft 712 and the hole 724 may be threaded such that the handle 704 automatically rotates into the position shown in FIG. 7 when lowered and automatically rotates into the position shown in FIG. 8A when raised.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A tray for storing minimum contact area (MCA) components of a substrate processing system, the tray comprising:
 a first compartment including at least one of a first lift pin tray and a first plurality of holes, wherein
  the first lift pin tray includes a plurality of slots configured to retain lift pins of the substrate processing system, and
  the first plurality of holes is configured to receive MCA pins of the substrate processing system; and
 a first cup arranged adjacent to the first compartment, wherein the first cup includes a bottom surface, a sidewall, and a wall at least partially surrounding the first cup, wherein the sidewall extends upward from the bottom surface to the wall, wherein the wall separates the first cup from the first compartment, and wherein an upper edge of the wall extends above a bottom surface of the first compartment,
 wherein the first cup includes a guide channel formed in the bottom surface of the first cup, and wherein the guide channel extends from the bottom surface and upward along the sidewall to the wall at least partially surrounding the first cup.

2. The tray of claim 1, wherein the tray includes a second compartment and a second cup arranged adjacent to the second compartment.

3. The tray of claim 2, wherein the second compartment includes at least one of a second lift pin tray and a second plurality of holes.

4. The tray of claim 1, wherein the first lift pin tray includes identifiers of respective ones of the lift pins.

5. The tray of claim 1, wherein a number of the plurality of slots corresponds to a number of the lift pins in the substrate processing system.

6. The tray of claim 1, wherein the first lift pin tray includes an identifier of locations of respective ones of the lift pins in the substrate processing system.

7. The tray of claim 1, wherein the first lift pin tray includes a sub-tray having a depth greater than a depth of the plurality of slots.

8. The tray of claim 1, wherein a number of the first plurality of holes corresponds to a number of the MCA pins in the substrate processing system.

9. The tray of claim 1, wherein the first plurality of holes is arranged in a pattern corresponding to a pattern of the MCA pins in the substrate processing system.

10. The tray of claim 1, wherein depths of the first plurality of holes correspond to lengths of the MCA pins minus an offset.

11. The tray of claim 1, wherein depths of the first plurality of holes correspond to lengths of the MCA pins plus a diameter of MCA bearings minus an offset.

12. The tray of claim 1, wherein the guide channel extends from the bottom surface of the first cup to the wall at least partially surrounding the first cup.

13. The tray of claim 12, wherein the wall at least partially surrounding the first cup includes a notch aligned with the guide channel.

14. The tray of claim 1, wherein a bottom surface of the first cup is at least one of flat and concave.

15. The tray of claim 1, wherein an interface between sidewalls and a bottom surface of the first cup has a radius of curvature between 0.375 inches and 0.625 inches.

\* \* \* \* \*